United States Patent [19]

Satomura

[11] 3,945,831
[45] Mar. 23, 1976

[54] PHOTOSENSITIVE RESINS CONTAINING A THIENYLACRYLIC ACID ESTER OR AMIDE GROUP

[75] Inventor: Masato Satomura, Asaka, Japan

[73] Assignee: Fuji Photo Film Co., Ltd., Minami-ashigara, Japan

[22] Filed: Jan. 2, 1974

[21] Appl. No.: 430,123

[30] Foreign Application Priority Data
Dec. 29, 1972 Japan.................................. 48-2539

[52] U.S. Cl. .................. 96/86 P; 96/35.1; 96/87 R; 96/115 R; 204/159.14
[51] Int. Cl.² ...................... G03C 1/68; G03C 5/00
[58] Field of Search ......... 96/115 R, 86 P, 87, 35.1; 204/159.14, 159.15, 159.22, 159.23; 260/79.5 R

[56] References Cited
UNITED STATES PATENTS

| | | | |
|---|---|---|---|
| 3,497,354 | 2/1970 | Steppan et al. ................... | 96/115 R |
| 3,499,759 | 3/1970 | Maar et al. ........................ | 96/115 R |
| 3,738,973 | 6/1973 | Augarten et al. ................. | 96/115 R |
| 3,770,443 | 11/1973 | Osada et al. ...................... | 96/115 R |
| 3,804,628 | 4/1974 | Osada et al. ...................... | 96/115 R |

Primary Examiner—Edward C. Kimlin
Attorney, Agent, or Firm—Sughrue, Rothwell, Mion, Zinn & Macpeak

[57] ABSTRACT

Photosensitive resins comprising high molecular weight compounds containing a thienylacrylic acid ester or amide group. These resins can be used for formation of images, optionally, in combination with at least one sensitizer. These resins have extremely high photosensitivity in comparison with conventional photosensitive high molecular weight compounds. The methods of preparing the polymer and the thienylacrylic acid ester or amide functional group containing monomers are disclosed.

25 Claims, No Drawings

PHOTOSENSITIVE RESINS CONTAINING A THIENYLACRYLIC ACID ESTER OR AMIDE GROUP

BACKGROUND OF THE INVENTION

1. Field of the Invention

This invention relates to photosensitive materials for the formation of relief images, printing plates and photographic reproductions, and in particular, to photosensitive materials comprising photosensitive high molecular weight compounds which have a β-thienylacrylic acid ester or amide group as a functional group.

This invention also relates to monomers which can be polymerized to form these photosensitive high molecular weight compounds.

2. Description of the Prior Art

Heretofore, many studies have been made on systems which undergo changes in solubility, adhesiveness, hardness or the like at the areas irradiated with light, particle rays or electromagnetic waves, and some of them are presently being used to prepare lithographic printing plates, stencils, photoresists, photohardenable paints and similar photomechanical images.

In the prior art, much research has been conducted on light sensitive compounds such as α, β-unsaturated carboxylic acid derivatives and α, β-unsaturated carbonyl compounds (for example, (1) J. Kosar, *Light Sensitive Systems*, John Wiley & Sons, New York, 1965, Chap. IV; (2) A. Schönberg, *Preparative Organic Photochemistry*, Springer-Verlag, New York, 1968, Chap. 8). In particular, the photoaddition four-membered ring-forming reaction of cinnamic acid derivatives has been studied extensively among the unsaturated carboxylic acids (for example, (3) P. Silber, *Ber. dtsch. Chem. Ges.*, 35, 4128 (1902)) and, furthermore, the application of high molecular weight compounds having cinnamic acid ester groups to a lightsensitive system has also been well studied (for example, Silber, ibid., U.S. Pat. Nos. 2,835,656; 3,357,831; 3,737,319; 3,418,295; 3,647,470; 3,409,593; 2,956,878; 3,173,787; 3,023,100; 3,066,117; 3,748,144 and 3,756,820 and British Pat. No. 695,197). In these studies, however, functional group containing polymers having sufficient sensitivity using commercially available, simple structures and simple procedures have not yet been obtained.

An object of the present invention is to provide a photosensitive system in which the disadvantages of prior art systems, especially with respect to sensitivity, have been overcome.

SUMMARY OF THE INVENTION

The inventors have found and developed photosensitive systems where high molecular weight compounds containing a β-thienylacrylic acid ester or amide group are used as photosensitive high molecular weight compounds, which have not been studied well in the prior art. As a result thereof, photosensitive resins having a markedly higher sensitivity than high molecular weight compounds containing a cinnamate group have been obtained. For example, the unsensitized materials of this invention are about seven times as sensitive as commercially available sensitized polyvinyl cinnamates and about 3 times as sensitive as polyvinyloxyethylfurylacrylate. In addition, this invention also provides photosensitive systems comprising these photosensitive high molecular weight compounds containing a β-thienylacrylic acid or amide group and one or more sensitizers.

The functional group containing polymer (hereinafter simply polymer) of this invention contains therein repeating units of the following general formulas

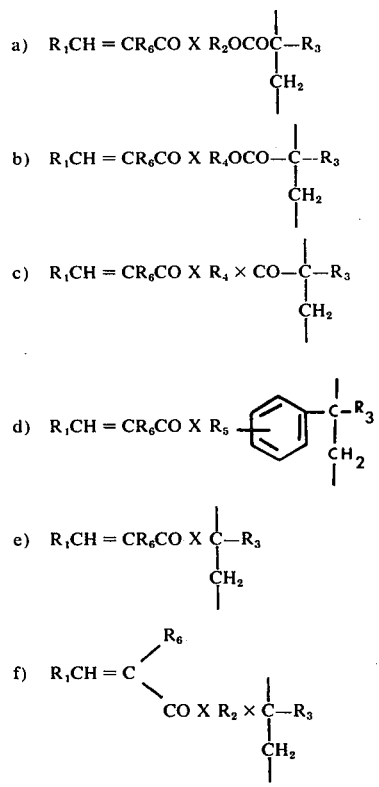

wherein $R_1$ is 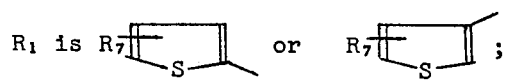

$R_2$ is

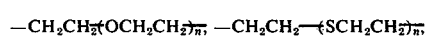

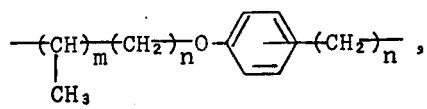

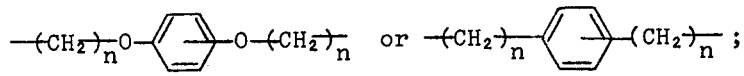

$R_3$ is a hydrogen atom or a methyl group;
$R_4$ is

—CH$_2$CH$_2$—, —CH$_2$CH$_2$—CH$_2$—,

—CH$_2$—CH— , —CH$_2$CH— ,
　　　|　　　　　　　|
　　CH$_2$Cl　　　　CH$_3$

—CH$_2$CH$_2$(OCH$_2$CH$_2$)$_{\overline{n}}$

—CH$_2$—CH—　or　—CH$_2$CH—(—OCH$_2$CH)$_{\overline{n}}$ ;
　　　|　　　　　　　　　|　　　　　|
　　C$_2$H$_5$　　　　　CH$_3$　　CH$_3$ $R_5$ is —(CH$_2$)$_{\overline{m}}$;
$m$ is 0 or 1;
$n$ is 1, 2, 3 or 4;
X is —O—, —S—, —NH— or —NR$_8$—
$R_6$ is a hydrogen atom, H—(CH$_2$)$_{\overline{n}}$, a cyano group or a carbamoyl group
$R_7$ is a hydrogen atom, a chlorine atom, a bromine atom, H—(CH$_2$)$_{\overline{n}}$, H—(CH$_2$)$_{\overline{n}}$O—, a nitro group, a sulfo group, a carboxy group, a cyano group, a phenyl group, a phenoxy group, an acetyl group, or a benzoyl group; and
$R_8$ is H(CH$_2$)$_{\overline{n}}$ or

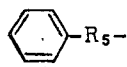

DETAILED DESCRIPTION OF THE INVENTION

First, as the processes for producing the polymer compound used in the invention, the following processes are suitable, any one of which being conveniently employed.

1. A process utilizing the reaction of a polymer; which comprises reacting a synthetic or natural polymer compound having reactive groups such as hydroxy, amino, lower alkyl amino, or mercapto groups with the corresponding acid halide such as β-thienylacryloyl chloride in the presence of base, reacting a polymer having reactive group such as an aliphatic halogen atom with a corresponding acid metal salt such as sodium β-thienylacrylate in the presence of a quaternary ammonium salt.

2. A process utilizing a vinyl polymerization reaction; which comprises homopolymerizing or copolymerizing a monomer having both an addition-polymerizable group and a thienylacrylic acid ester or amide group.

The high polymer compound of this invention suitably has a [η] in dimethylformamide or methylethylketone of 0.01 to 3.0, preferably 0.2 to 1.5 at 30°C.

As the synthetic or natural polymer compounds which can be used in process (1), there are synthetic polymer compounds having reactive groups such as hydroxy, amino, lower alkylamino, or mercapto groups, such as polyvinyl alcohol, polyethyleneimine, the hydrolyzed products of homo- or co-polymers of vinyl acetate such as polyvinyl acetate partial hydrolysis products, ethylene vinyl acetate copolymer hydrolysis products, etc.; hydroxy containing, amino containing, mercapto or halogen containing monomer copolymers with monomers such as chlorostyrene, methoxystyrene, styrene, methacrylic acid esters, and acrylic acid esters (such as the methyl, ethyl, propyl, butyl, hexyl, methoxyethyl, sulfopropyl, methoxyethoxyethyl, benzyl, and lauryl esters), ethylene, vinyl toluene, vinyl acetate, vinyl pyrrolidone, acrylic acid, methacrylic acid, acrylamide, diacetone acrylamide, acryloylmorpholine, acrylanilide, methacrylamide, acrylonitrile, methacrylonitrile, vinyl propionate, vinyl methyl ether, vinyl ethyl ether, vinyl butyl ether, vinyl isobutyl ether, vinyl chloroethyl ether, vinyl phenyl ether, propylene, octene-1, β-propiolactone, etc., in which the hydroxy, mercapto, amino or halogen containing representative monomer has the formula

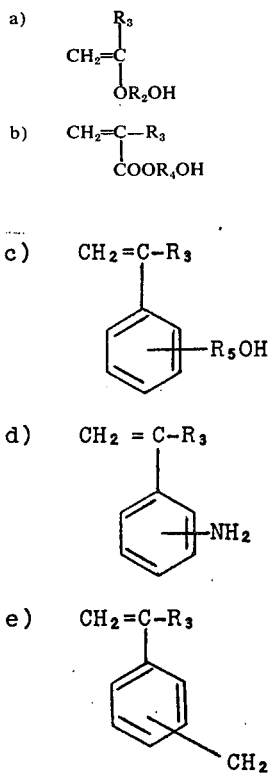

in which the halogen containing representative monomer has the formula

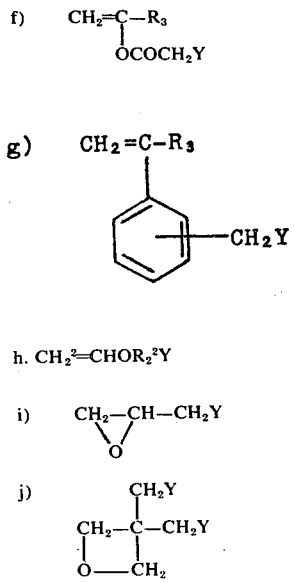

k) 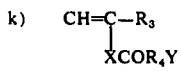

wherein $R_2 - R_5$ and X are the same as described before, and Y is a chlorine atom or a bromine atom. Others such as epoxy resins; alkyd resins such as glycerin phthalic acid, or glycerin adipic acid; polyvinyl amine as disclosed in Hart, *Makromol Chem.*, 3251 (1959); etc., and natural polymer compounds such as partially acylated cellulose, hydroxyalkyl celluloses such as hydroxymethyl, hydroxyethyl or hydroxypropyl cellulose, gelatin, starch, etc., can be used.

Of the hydroxy, mercapto, amino or halogen containing monomers, preferred monomers are as follows;
1. $CH_2=CHCOOCH_2CH_2OH$
2. $CH_2=CHCOOCH_2CH_2CH_2OH$
3. $CH_2=CHCOOCH_2CH(CH_3)OH$
4. $CH_2=C(CH_3)COOCH_2CH_2OH$
5. $CH_2=C(CH_3)COOCH_2CH_2CH_2OH$
6. $CH_2=C(CH_3)COOCH_2CH(CH_3)OH$
7. $CH_2=C(CH_3)COOCH_2CH(CH_2Cl)OH$
8. $CH_2=CHCOOCH_2CH(CH_2Cl)OH$ 9) 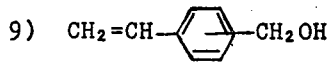

10) $CH_2=C(CH_3)COOCH_2CH_2OCH_2CH_2OH$
11) $CH_2=CHOCH_2CH_2Cl$

12) 

13) 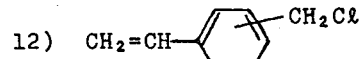

14) 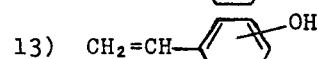

Of these above described monomers, monomers 1 – 12 are commercially available, monomers 13 – 14 can be easily obtained using well known procedure. The thienylacrylic acid halides which can be used are of the general formula

wherein $R_6$, $R_7$ and Y are the same as that defined before. The preferred thienylacrylic acid halides are

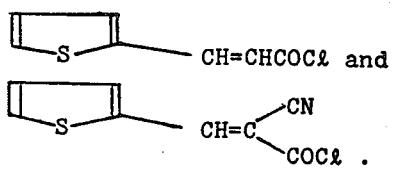

The thienylacrylic acid metal salts which can be used to react with the halogen containing compound described above are of the general formula

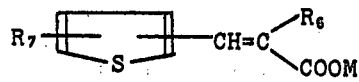

wherein M is a monovalent metal such as an alkali metal, e.g., sodium or potassium. Preferred thienylacrylic acid metal salts are

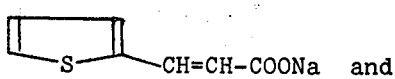 and

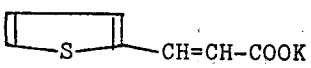

As the base used in process (1), various inorganic or organic base catalysts which are employed for conventional esterification reactions and amidation reactions can be utilized.

Suitable bases which can be employed in process (1) are bases such as pyridine, picoline, lutidine, quinoline, triethylamine, triethylenediamine, N,N'-dimethylpiperadine, N-methylmorpholine, dimethylaniline, diethylaniline, sodium hydroxide, potassium hydroxide, sodium carbonate, and basic anion exchange resins. Of these the ones most generally employed are pyridine, triethylamine and sodium hydroxide. The amount of base generally used is 0.05 to 200 mole percent, preferably 0.2 to 2 molar equivalents to the hydroxy group, the amino group, the halogen atom, or the mercapto group. Also, where inorganic bases are used, it is important to maintain the reaction temperature low in order to minimize hydrolysis of the ester produced. Generally a temperature of about $-10°$ to $+25°C$ is employed.

As the quaternary ammonium salt which can be used in process (1), conventional quaternary ammonium salts which are generally employed for esterification reactions can be utilized.

Suitable such quaternary ammonium salts are trimethylbenzylammonium chloride, trimethylbenzylammonium bromide, triethylbenzylammonium chloride, tetraethylammonium iodide, triethylmethylammonium iodide, cetylpyridinium chloride.

The amount of the quaternary ammonium salt generally used is about 0.1 to 25 weight percent, preferably 10 to 15 weight percent to the weight of the thienylacrylate metal salt.

As the monomers which can be used in process (2), there are the thienylacrylic acid esters or amides of vinyl monomers containing an active hydrogen such as hydroxy, mercapto, or amino group(s), such as β-hydroxylalkyl acrylate, hydroxyalkyl acrylamide, alkylene glycol monoacrylate, aminoalkyl acrylamide, dihydroxypropyl acrylate, those methacrylates or methacrylamides corresponding to the previously recited acrylates and acrylamides, aminostyrene, hydroxystyrene, hydroxyalkylstyrene, hydroxyethyl vinyl ether, etc., and those prepared by reacting, reversely, thienylacrylic acid esters containing a hydroxy group or amino group with a vinyl group-containing compound such as acrylic acid chloride. Furthermore, halogen containing monomers can also be used as previously described.

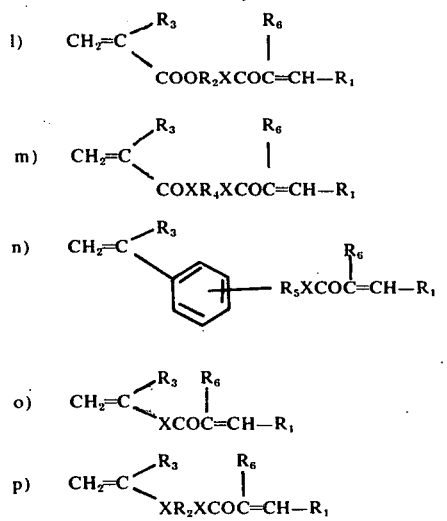

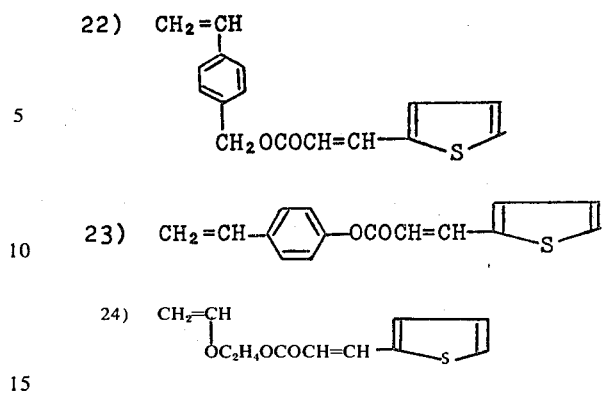

wherein $R_1$, $R_2$, $R_3$, $R_4$, $R_5$, $R_6$ and X are the same as defined before. Of these, the following monomers are preferred.

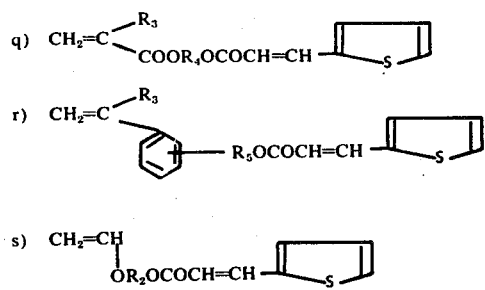

wherein $R_2$, $R_3$, $R_4$ and $R_5$ are as defined before.
Specific examples of suitable monomers are

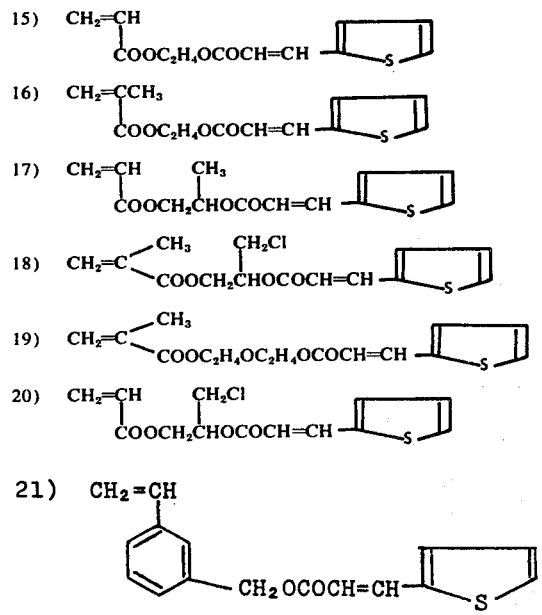

In the reaction of process (2), the same reaction procedure shown with respect to process (1) can be applied with little modification.

In the reaction of the halide with the thienylacrylic acid salt in the presence of the quaternary ammonium salt, a high reaction temperature (generally about 100° to 160°C, preferably 120° to 140°C) and a long reaction time (about 2 to 6 hours, more generally 3 to 5 hours) are employed to complete the reaction. Thermal polymerization inhibitors such as hydroquinone, cupric oxide, cuprous acetate, anthraquinone, phenylnaphthylamine, etc. can be and generally are used, in an amount of 0.01 to 15 weight percent, preferably 0.1 to 5 weight percent, to prevent spontaneous thermal polymerization.

Solvents such as dimethylformamide, dimethylacetamide, methylmorpholine or N-methylmorpholine (these solvents having boiling points above about 120°C) are useful in the process.

The reaction of chloromethyl styrene and an acid sodium salt has already been studied well as for example in U.S. patent application Ser. No. 377,006, filed July 6, 1973.

As the monomer copolymerizable with the above-described monomers, ethylene, butadiene, vinyl chloride, vinylidene chloride, vinyl acetate, vinyl propionate, styrene, vinyl toluene, chlorostyrene, nitrostyrene, acrylic acid, methacrylic acid, maleic anhydride, acrylamide, acrylonitrile, methacrylic acid esters or acrylic acid esters (for example, the methyl, ethyl, ethylhexyl methoxybutyl, hydroxyethyl, ω-hydroxy-3,6-dioxaoctyl, 5-hydroxy-3-oxa-amyl, dihydroxypropyl, or glycidyl esters), cellosolve acrylate, vinyl pyrrolidone, vinyl sulfonic acid, alkyl vinyl esters such as vinyl butyl ether, etc. can be used. Preferred comonomers can be easily and freely changed according to the polymer characteristics desired. For example, if adhesivity or flexibility is desired, acrylonitrile, an acrylic acid ester or a methacrylic acid ester can be used as comonomers. If water solubility is desired, vinyl pyrolidone, vinyl methyl ether, hydroxy alkyl acrylate, hydroxy alkyl acrylamide, or methacrylate, methacrylamide, acrylamide, sulfopropyl acrylate, or vinylbenzene-sulfonic acid can be employed. The comonomer ratio is closely related to reactivity and, at least 0.02 mole percent of the photosensitive monomer and preferably, 0.2 mole percent of the photosensitive monomer is generally used, for example, for a light-sensitive polymer.

In the polymerization of these monomers, conventional techniques known for the polymerization of acrylic acid derivatives, methacrylic acid derivatives or vinyl ethers can conveniently be employed. More specifically, in process (2) a vinyl polymerization method is employed utilizing generally, temperatures of about −80° to +80°C, a time of about 2 minutes to 15 hours and with a comonomer present a molar ratio of at least 0.02 mol%, preferably 0.2 mol%, of the monomer and a vinyl polymerization catalyst. These general procedures can be modified and applied based on knowledge in the art, as disclosed in *Preparative Methods of Polymer Chemistry* by W. R. Sorensen et al., John Wiley & Sons, New York, (1961), *Polymer Handbook* 3rd printing by E. H. Immergut et al, John Wiley & Sons, New York (1967) and Murahashi, *Synthetic Polymer*, 1972; Asakura, Tokyo and the cited references therein.

When the polymerization reaction is carried out, a radical polymerization catalyst or an ionic polymerization catalyst can be used according to the reaction or the physical properties of the final product polymer. For example, such a catalyst can be chosen from the azo compounds (for example, α-cyano or α-carboxyazo compounds such as azobisdimethylvaleronitrile, azobisethylpropionate, azobisethylisobutyrate, azobisphenylethane, azobiscyclohexanedinitrile, azobisisobutyronitrile), peroxides (for example, benzoyl peroxide, lauroyl peroxide, butyroyl peroxide, diisopropyl percarbonate, benzoyl glutaryl peroxide, acetyl peroxide, t-butylhydroperoxide, etc.), peracid esters, persulfates, aluminum chloride, triethyl aluminum, dialkyl-aluminum chloride, boron trifluoride, boron fluoride/ether adduct, alcohol adduct or organic acid adduct, and diethyl zinc. Of these a radical initiator is the most convenient to use. Generally the amount of the catalyst will range from about 0.01 to 20 wt% to the total amount of the monomer or monomers. The catalyst ratio to the monomer is closely related to the molecular weight of the polymer to be obtained. Too much catalyst decreases the molecular weight and broadens the molecular weight distribution of the polymer. Suitable polymerizaton techniques which can be employed are bulk polymerization, solution polymerization, suspension polymerization, emulsion polymerization or graft polymerization.

Needless to say, other polymers such as ethylene/vinyl-acetate copolymer, polyvinyl acetate, polyvinyl pyrrolidone, polymethylmethacrylate or polyvinyl acetal, dyes, or pigments, such as quinacridone, phthalocyanine, phthalocyanine blue or porphyrin metal complexes, etc. can be present during the polymerization reaction. If polymerization is conducted in the presence of these materials, the compatibility and uniformity are largely improved in comparison with these properties when the polymer is mixed with these materials after polymerization.

The thus obtained photosensitive polymer compounds undergo a change in solubility, adhesiveness, hardness or a like physical property due to the action of photons, electromagnetic waves, bombardment with particles or the like.

Although the precise reaction mechanism for this change has not yet been completely clarified and while not desiring to be bound, the mechanism could possibly be as follows.

Two mechanisms are possible, that is (a) an intermolecular or interpolymer addition reaction of the internal double bond adjacent the thiophene ring to form a cyclobutane ring or to form an addition polymer and (b) that of inner thiovinyl ether group of thiophene ring to form a cyclobutane ring.

While the polymer compound used in the present invention is particularly useful as a photosensitive composition, it is possible to shorten the irradiation time and to produce the desired difference in physical property by adding, as a sensitizing agent, an aromatic carbonyl compound, an aromatic nitro compound, an aromatic quinone, a triphenyl methane, an anthrone, a nitroaniline, an acylated nitroaniline, a thiazole, a benzoylmethylene, β-naphthothiazoline, a ketone, a pyrylium dye salt, a thiapyrylium dye salt, a benzothiazoline, a naphthothiazoline, a quinolizone, an acridone, a cyanine dye, a dithiolium salt, and α-ketoaldonyl compound, a diazole, a triazole, an oxazole, or various photographic sensitizing dyes.

Specific examples of such useful sensitizing compounds are nitro compounds such as p-nitrodiphenyl, 5-nitro-2-aminotoluene, 4-nitro-1-aminonaphthalene, 4-nitro-1-acetylaminonaphthalene, picric acid, picramide, dichloronitroanilene, nitroacenaphthene, dinitronaphthalene, trinitrofluorenone, tetranitrocarbazole, dinitrobenzoanthrazenedione, dinitrodimethylacetyl-tert-butylbenzene, dinitrostylbene disulfonic acid, trinitronaphthalene, and dinitrochalcone, carbonyl compounds such as benzanthrone, 9-anthraldehyde, acetonaphthone, xanthone, benzophenone, phenanthrenquinone, benzanthraquinone, t-butylanthraquinone, chloroanthraquinone, anthraquinone, naphthoquinone, benzophenone, furanone, 2,6-bis-p-azidobenzal-4-methylcyclohexanone, benzoin, pinaloin, 2-methoxy-2-phenylacetophenone, 2-ethoxy-2-phenylacetophenone, α-methylbenzoin, α-allylbenzoin, α-phenylbenzoin, tetramethylaminobenzophenone, tetraethylaminobenzophenone, dimethoxybenzophenone, dimethoxythiobenzophenone, 1-cyano-2-keto-3-methyl-6-bromo-3-azabenzanthrone, 1-carboethoxy-2-keto-3,4-diazabenzanthrone, 2-keto-3-methyl-1,3-diazabenzanthrone, diphthaloylnaphthalene, 2-benzoylmethylene-1-β-naphnothiazoline, 4-H-quinolizine-4-thione, tetramethylamino thiobenzophenone, erythrosin, 6-dimethylamino-4-methylcoumarin, 2-benzoylmethylene-1-methyl-benzothiazoline, 2-nitrophthaloylmethylene-1-ethyl-benzothiazoline, dimethylcarbamoylmethyleneethylbenzothiazoline, and diethylcarbamoylmethyleneethylbenzothiazoline, and dyes such as methyl violet, victoria blue, and malachite green (triphenylmethane dyes), diethyldibenzothiacyanine iodide, diethyldibenzothiacarbocyanine bromide, and dimethyldibenzothiacyanine iodide (cyanine, thiocyanine dyes), 2-benzoylmethylene-3-ethylnaphtho[1,2-d]-thiazoline, 2,5-bis-(4-dimethylaminophenyl)-oxidazole, 2-(4-diethylaminophenyl)-phenanthio-(9,10)-4,5-oxazole, 2-(p-cyanobenzoylmethylene)-3-ethyl-naphtho-[1,2-d]thiazoline, 3-ethyl-2-[p-(trifluoromethyl) benzoylmethylene]-naphtho[1,2-d]thiazoline, 5-chloro-2-(p-cyanobenzoylmethylene)-3-ethylbenzothiazole, methyl-3-ethyl-2-benzothiazolinylidenedithioacetate, 2,6-di(p-ethoxyphenyl)-4-(p-n-amyloxyphenyl)-thiapyrylium perchlorate, 2,4,6-triphenylpyrylium perchlorate, 4-(4-methoxyphenyl)-2,6-diphenylpyrylium perchlorate, 4-(2,4-dichlorophenyl)-2,6-diphenylpyrylium perchlorate, 2,6-bis(4-methoxyphenyl)-4-phenylpyrylium perchlorate, 6-(4-methoxyphenyl)-2,4-diphenylpyrylium perchlorate, 2-(3,4-dichlorophenyl)-4-(4-methoxyphenyl)-6-phenylpyrylium perchlorate, 4-(4-amyloxyphenyl)-2,6-bis(4-ethylphenyl)pyrylium perchlorate, (pyrylium salts) are also suitable. Of these sensitizers, the carbonyl compounds show superior sensitizing effect in comparison with the nitro compounds. Some of these compounds are described in U.S. Pat. Nos. 3,475,617; 3,737,319; 3,453,110; 3,409,593; 3,575,929; 2,835,656; 3,357,831; 3,418,295; 3,647,470; 2,956,878; 3,173,787; 3,023,100; and 3,066,117, and British Pat. No. 659,197. The sensitizer is basically used in a substantially effective amount, i.e., in that amount which provides a sensitizing function. The sensitizer is generally used at a level of 0.01 to 20 weight percent to the polymer, preferably 0.3 to 10 weight percent.

Also, polyfunctional α, β-unsaturated acid derivatives can be used, if desired, in combination with the polymer of this invention to accelerate image formation. Suitable examples of such polyfunctional α, β-unsaturated acid derivative are, for example, ethylene glycol dimethaacrylate, pentaerythrytol tetraacrylate, ethylenediaminediacrylate, paraphenylenediamine disorbamide, triethylene glycol diacrylate, glycerin trimethacrylate, ethylene glycol diacrylate, triethylene glycol diacrylate, neopentyl glycol dimethacrylate, hexylethylacrylate, chlorostyrene, vinylbenzophenone, diallylphthalate, divinyl phthalate, and the like.

Particularly preferred are those examples which contain a number of polymerizable groups so that branching and cross-linking of the polymer formed occurs. Their proportion of the layer weight can be up to 25 percent by weight based on the weight of the polymer of this invention.

In order to form images using the above-described polymers of the present invention, the polymer is dissolved, together with the above-described sensitizing agent, in a solvent at a concentration of about 0.5 to 50 wt.%, preferably 2 to 15 wt.%, such as a ketone solvent, an amide solvent, a halogenated aromatic solvent, an aromatic ether solvent, a cellosolve solvent, a halogenated aliphatic solvent, etc., or mixtures thereof, and the resulting solution is applied to a support such as a high polymer film (e.g., a film of polyethylene terephthalate, polyvinyl acetate, nylon, polyethylene, polypropylene, polyalkylmethacrylate, polytetrafluoroethylene, a cellulose ester such as cellulose acetate, cellulose acetate butyrate, cellulose propionate, a polyethylene coated paper, a polypropylene coated paper, polyvinyl butyral, polyethylene naphthalate, etc.), a metal plate (e.g., a zinc plate for use in printing, an aluminum plate, a copper plate, magnesium foil, etc.) a glass and glass coated with such metals as chromium, chromium alloys, steel, silver, gold, platinum, a metal oxide plate such as zinc oxide, aluminum oxide, or a silicon wafer, using a coating method such as dicoating, rod-coating, spinner-coating, spray-coating, lamination, etc. to prepare a light-sensitive plate. Suitable solvents which can be employed are alcohols such as β-methoxyethanol, β-butoxyethanol, diethyleneglycol, β-acetoxyethanol, β-phenoxyethanol, β-ethoxypropanol, isopropanol, cyclohexanol, ketones such as acetone, 4-methyl-2-pentanone, acetylacetone, hexanedione, 4-butyrolactone, acetophenone, cyclohexanone, methyethylketone, methylisobutylketone, esters such as 2-ethoxyethylacetate, 2-methoxyethyl acetate, 2-butoxyethyl propionate, 3-phenylpropyl acetate, n-amylacetate, isobutyl acetate, n-butylacetate, cyclohexylacetate, methylcyclohexylacetate, chlorinated hydrocarbons such as chloroform, dichloroethane, trichloroethane, tetrachloroethane, carbon tetrachloride, trichloroethylene, chlorobenzene, amides such as formylmorpholine, dimethylformamide, dimethylacetamide, pyrrolidone, butyrolactone, hexamethylphosphoramide, methylphenylsulfone, ethers such as dimethoxyethane, dimethoxypropane, diethyleneglycol dimethylether, anisole, dimethyl sulfoxide, mixtures of these solvents and the like. The optimum coating thickness for a particular purpose will depend on such factors as the use to which the coating will be put, the particular light-sensitive composition employed, and the nature of other components which may be present in the coating solution. Typical coating thickness on a support can range from about 0.5 to 250μ, preferably 2 to 10μ. If desired, the coating composition can be first coated on a temporary support and then transferred, e.g., by thermal lamination to the support where it is to be used, either uniformly or in an imagewise fashion. Such transfer techniques are described, for example, in U.S. Pat. Nos. 3,060,023; 3,346,383; 3,469,982; etc. The coating compositions also can include a variety of photographic addenda utilized for their known purposes such as agents to modify the flexibility of the coating, agents to modify its surface characteristics, dyes and pigments as disclosed in U.S. Pat. No. 3,740,219 such as $TiO_2$, $ZyO_2$, $Fe_3O_4$, $Fe_2O_3$, $Al_2O_3$, $SiO_2$, $CaCO_3$, $CrO_2$, $BaSO_4$, $ZrO_2$, $Ca_3(PO_4)_2$, carbon black, graft carbon, etc., to impart color to the coating, agents to modify the adhesivity of the coating to the support, antioxidants, preservatives as disclosed in U.S. Pat. No. 2,656,271. Non-light sensitive polymers, surface active agents as disclosed in U.S. Pat. Nos. 3,545,974; 3,475,174; 3,442,654; 3,441,413; 3,415,649; 3,294,540; etc. can also be added to the coating compositions to serve as diluents or extenders, and solid particles, such as glass microbeads having an average diameter of about 1 to 10μ, and a variety of other addenda known to those skilled in the art, for example, as disclosed in J. Kosar, *Light Sensitive Systems*, Chapters 3 to 7 and in the references cited therein, can be employed in the coating composition where desired. Examples of non-light sensitive polymers which can be incorporated in the coating compositions are phenol resins such as thermoplastic phenol resins or solvent soluble resole resins, hydrophilic polymers such as cellulose, hydroxyethylcellulose, hydroxypropylcellulose, ethylcellulose, cellulose hydrogen phthalate, cellulose triacetate, cellulose acetate butyrate, carboxymethylcellulose, polyethylene oxide, polypropylene oxide, other thermoplastics such as ethylene vinylacetate copolymers, polyvinyl formal, polyvinyl acetal, polyvinyl butyral, polyvinyl pyrrolidone, polyvinyl methylacetamide, ethylene-sodium acrylate co-polymers, styrene-maleic anhydride co-polymers or derivatives thereof, polyvinyl acetate, methyl-methacrylate-acrylic acid co-polymers, vinyl acetate-crotonic acid copolymers, methylstyrene-methacrylic acid copolymers, methylvinyl ether-maleic anhydride copolymers, polyvinyl chloride, latex polymers as disclosed in U.S. Pat. Nos. 3,411,911; 3,488,708; 3,111,912; 3,220,844; 3,193,386, etc., silicone rubbers, polytrifluoroethylene, polyethylene beads, polychlorostyrene, alkyd resins, and the like. These additional polymeric materials can constitute up to 25% by weight of the polymeric component of the coating composition.

These polymers are applied to modify the physical properties, to serve as a diluent, to adjust certain layer properties such as solubility, flexibility, anchorage, abrasion resistance, developability, and to improve the resistance of the polymer composition to etchants.

Suitable plasticizers which can be used to modify the thermo-mechanical properties of the coating composition are esters such as triphenyl phosphate, butyl phthalate, phenylphthalate, diethyleneglycol diphthalate, sulfonamides such as N-cyclohexyltoluenesulfonamide, and polyvinyl methylether. The amount of plasticizer employed in the polymer composition will also vary depending upon factors such as the particular plasticizer employed, the presence of other components in the polymer composition the ultimate use to which the photosensitive layer is to be put and the like. Generally, the plasticizer is employed in amount of between about 25 and 200 percent by weight based on the weight of the polymer in the coating composition. Suitable antioxidants such as propyl gallate, hydroquinone, phloroglucinol, resorcinol, thiourea, p-methoxyphenol, t-butylhydroquinone, di-t-octylhydroquinone, t-butylcatechol, naphthol, copper resinate, naphthylphenylamine, cuprous chloride, di-t-butylcresol, phenolthiazine, p-toluquinone, dinitrobenzene, tetramethoxybenzophenone, dihydroxybenzophenone, as well as those described in U.S. Pat. No. 2,691,584 can be employed. The optimum amount of those components described above and others can be readily determined by those skilled in the art taking the preceding techniques into consideration. The photomechanical images can be prepared in the lightsensitive layer by imagewise exposing the layer to a light source to harden or insolubilize the resin in the exposed area, while superposing thereon an original to be duplicated. The exposure can be carried out using irradiation of a mercury lamp, a high pressure mercury lamp, a carbon arc lamp, a cathode ray tube, a laser beam, a tungsten lamp, a photoflood lamp, an electron beam, ultraviolet rays, a xenon lamp, etc., as the energy source. And the irradiation time can be changed easily depending on the energy source, the distance of the light source from the photosensitive material and the sensitizer employed. Exposures of from about 0.001 second to about 20 minutes, preferably 0.1 second to about 2 minutes, are generally adequate. The exposed plate is processed with a solvent containing a dye or a pigment to obtain more distinct image formation. Conventional processing procedures used, in general, for light-sensitive systems (see, for example, Kosar Light Sensitive Systems, John Wiley & Sons 1965) can be employed with only minor modification. The polymer compound at the image areas does not undergo a photo hardening reaction and is dissolved in the solvent. The dye or pigment adheres to the hardened areas to form images. Such solvents can be selected from the solvents listed above in detail as suitable coating solvents as well as other solvents or such solutions as alkaline aqueous solutions, acidic aqueous solutions and the like. In an alternate embodiment using the photosensitive material of this invention, an image can be formed by exposure as described above and then the exposed elements developed by heating to a temperature in the range of about 50° to 200°C, which is intermediate between the point at which the polymer becomes tacky in the unexposed and the exposed areas to soften or render the polymer tacky in the unexposed areas. The softened polymer can then be toned or transferred to a receiving sheet under pressure and toned, or transferred to a receiving sheet under pressure and toned or transferred without toning if a pigment, dye or color forming compound is incorporated in the original layer.

The present invention will now be described in greater detail specifically by reference to the following synthesis examples of the functional monomer compounds of the present invention, the photosensitive polymer compounds of the present invention and image formation examples. These examples should not be interpreted as limiting the scope of the invention. Unless otherwise indicated all parts, percents, ratios and the like are by weight.

MONOMER SYNTHESIS EXAMPLE 1

Synthesis of β-Vinyloxyethylthienylacrylate (vinyl ether type)

In a 3-necked round bottom flask equipped with a cooler and a stirrer were charged 0.20 mole of sodium thienylacrylate, 100ml of β-chloroethylvinyl ether, 50ml of dimethylformamide, 2.0g of trimethylbenzylammonium chloride, 0.5g of phenylnaphthylamine and 1.0g of hydroquinone and the mixture was vigorously stirred at 120° to 150°C for about 5 hours. The sodium chloride formed was separated by filtration and the filtrate was distilled under reduced pressure (at 5 to 20mmHg, 25° to 100°C) to recover the low boiling fraction. The residue was further distilled under highly reduced pressure (at 0.1 to 0.5 mmHg). The product, boiling at 125°C/0.3mmHg, was obtained as a viscous liquid in a yield of 70%.

MONOMER SYNTHESIS EXAMPLE 2

Synthesis of β-Methacryloxyethylthienylacrylate (methacryl, acryl type)

In a 3-necked round-bottomed 300ml flask equipped with a calcium chloride drying tube and a dropping funnel were charged 0.10 mole of thienylacryloyl chloride (prepared from thienylacrylic acid and thionyl chloride in the presence of benzene and dimethylformamide), 20ml of methylethyl ketone, 0.11 mole of hydroxyethylmethacrylate with cold water cooling. Under vigorous stirring, 50 ml of pyridine was added over a 15 minute period to the mixture and the mixture was stirred at 0° to 20°C. After about 4 hours, 100ml of diethyl ether was charged to the mixture and the mixture was filtered into 100ml of ice cold 5% hydrochloric acid. The organic layer formed was treated with a hydrochloric acid solution to remove the water soluble portion. Then the organic layer was washed with water until the water layer become neutral.

The organic layer was dried using 5g of anhydrous magnesium sulfate and distilled at reduced pressure (10 to 30mmHg. 20° to 50°C).

The residue was recrystallized from hexane to give β-methacryloxyethylthienylacrylate as a white solid melting at 34.5° – 7°C in a yield of 85%. The corresponding acrylate can be prepared using a similar procedure as described above starting from hydroxyethylacrylate or hydroxychloropropyl acrylate.

POLYMER SYNTHESIS EXAMPLE 1

Synthesis of High Molecular Weight Compound 1

2.0 gram of β-vinyloxyethylthienylacrylate and 8.0ml of methylene chloride were charged in a polymerization ampoule purged with argon gas and, at −78°C, 4 mol%, based on the monomer, of a methylene chloride solution containing $4.3 \times 10^{-4}$ mol/ml of boron trifluoride etherate was added thereto. After maintaining the mixture at −78°C for about 1 hour, the contents of the ampoule were poured, under stirring, into 100ml of methanol containing a small amount of aqueous ammonia. Thus, a white high molecular weight compound precipitate was formed in an yield of about 90%, [$\eta$] = 0.21 (at 30°C in tetrahydrofuran).

Synthesis of High Molecular Weight Compound 2

The same procedures as described in Polymer Synthesis Example 1 were conducted except for using the following monomer mixtures.

To 2.5g of $\beta$-vinyloxyethylthienylacrylate, 1.3g of isobutyl vinyl ether and 6.0ml of methylene chloride was added 4 mol%, based on the monomers, of a methylene chloride solution containing $4.3 \times 10^{-4}$ mol/ml of boron trifluoride etherate. After maintaining the solution at −78°C for about 2 hours, the reaction mixture was treated in the same manner as described in Polymer Synthesis Example 1 to obtain a high molecular weight compound. The yield was 90%. [$\eta$] = 0.24 (at 30°C in tetrahydrofuran).

POLYMER SYNTHESIS EXAMPLE 3

Synthesis of High Molecular Weight Compound 3

73g of methylmethacrylate and 76g of hydroxyethylmethacrylate were dissolved in dimethylformamide and were polymerized with a small amount of 30mg of azobisdimethylvaleronitrile as an initiator for 3 hours at 60°C. Yield: 92% [$\eta$]30° DMF: 0.284.

The thus prepared high molecular weight compound having a hydroxyl group was reacted with a thienylacrylic acid halide to synthesize a high molecular weight compound having a thienylacrylate group. More precisely, 10ml of thionyl chloride were added to 0.02 mole of thienylacrylic acid in benzene to prepare thienylacrylic acid chloride as the acid halide. The resulting chloride was dissolved in 10ml of methyl ethyl ketone, and then a solution of dimethylformamide/methylethylketone (volume ratio: 26ml/9ml) containing 5g of the high molecular weight compound was slowly added dropwise to the resulting chloride solution while cooling with ice. Afterwards, 20ml of pyridine were added thereto as a catalyst for removal of the hydrogen chloride formed and to separate as pyridine hydrochloride. After stirring for 2 hours under cooling with ice, the reaction system was left for one night to complete the reaction. The resulting reaction mixture was poured into ice-water containing 5% hydrochloric acid to remove the water-soluble portion therefrom and then dissolved in 50ml of methyl ethyl ketone, and thereafter the methanol-soluble portion was further removed therefrom by re-precipitation from 100ml of methanol. The thus formed high molecular weight compound was isolated in the form of a white powder, and the weight thereof after drying was about 6g. It is believed that the esterification proceeded almost quantitatively in view of the fact that no hydroxyl group absorption was found in the IR spectrum at about 3,300 cm$^{-1}$.

POLYMER SYNTHESIS EXAMPLE 4

Synthesis of High Molecular Weight Compound 4

6g of $\beta$-methacryloxyethylthienylacrylate, 20mg of azobisdimethylvaleronitrile and 25mg of benzoyl peroxide were mixed well into a 15ml capacity glass tube equipped with a condenser. The tube was heated for about 8 hours, at 100° to 160°C. The contents of the tube were poured into 50ml of methanol. Thus, a high molecular weight compound precipitate in a quantitative yield was formed. The polymer was insoluble in hexane, benzene, diethyl ether and ligroin.

EXAMPLE 1

95% by weight methyl ethyl ketone solution of high molecular weight compound synthesized in Polymer Synthesis 1 above containing 0.25% of Michler's ketone was prepared. This solution was applied to a anodized aluminum plate in a dry thickness of 2 to 3 microns and dried. The plate was exposed to light through a transparent original for 1 minute using a 450W high-pressure mercury lamp at a distance of 30cm from the plate. Then the plate was treated with dimethylformamide for development to dissolve off the unexposed areas and then the plate was immersed in water. After treating with an oil soluble dye, the surface exposed was colored and these areas were sharply distinguished from the plate surface.

EXAMPLE 2

A 5% by weight dimethylformamide solution of the high molecular weight compound synthesized in the Polymer Synthesis Example 3 was prepared. This was applied to a surface-treated anodized and silicate treated aluminum plate using dip-coating and then the thus coated plate was heated and dried. After putting a step wedge thereupon, the plate was exposed to light through the wedge for 1 minute using a 450W high-pressure mercury lamp positioned at a distance of 30cm from the plate, and then the thus exposed plate was developed in methylethylketone for 1 minute. After coloration with an oil soluble dye, the resulting image was distinguishable up to three steps.

EXAMPLE 3

To 0.5ml of the light sensitive composition solution as described in Example 2 above were added 3mg of 5-nitroacenaphthene, as a sensitizer, and thereafter the same procedures as described in Example 2 were carried out. After coloration, the resulting image was distinguishable up to 12 steps. Between the three steps (Example 2) and the 12 steps (Example 3), the $\Delta D$ was 1.41, and therefore, it is noted therefrom that the light sensitivity of the preparation of Example 3 is increased by about 30 times over that of the former Example 2.

EXAMPLES 4 − 8

In place of the 5-nitroacenaphthene used in Example 3 other compounds as shown in the following Table were used and the results obtained are shown in the following Table.

TABLE

| Example No. | Compound | Amount Used | Maximum Steps Distinguishable |
|---|---|---|---|
| 4 | Tetranitrofluorene | 4mg | 4.5 |
| 5 | N-Methyl-2-benzoylmethylene-$\beta$-naphthothiazoline | 2mg | 13 |

TABLE-continued

| Example No. | Compound | Amount Used | Maximum Steps Distinguishable |
|---|---|---|---|
| 6 | Phenathrenequinone | 3.5mg | 9 |
| 7 | Diethylaminobenzophenone | 3.2mg | 12 |
| 8 | Dimethylaminobenzophenone (Michler's ketone) | 3.1mg | 11 |

From the results contained in the above Table, it can be seen that sufficient sensitizing effect was obtained in every preparation.

While the invention has been described in detail and with reference to specific embodiments thereof, it will be apparent to one skilled in the art that various changes and modifications can be made therein without departing from the spirit and scope thereof.

What is claimed is:

1. A photosensitive composition comprising as the main photosensitive component a high molecular weight polymer containing monomer units of the following general formula:

$$-R_1CH=CR_6COXR_2OCOC(-R_3)-;$$
$$\quad\quad\quad\quad\quad\quad\quad\quad\quad\quad CH_2$$

wherein
$R_1$ is

$R_2$ is

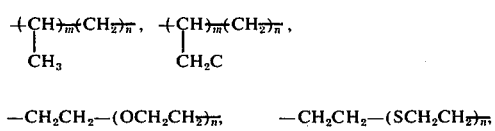

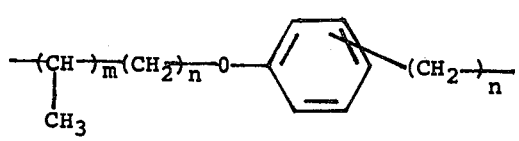

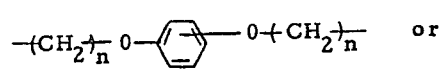 or

$R_3$ is a hydrogen atom or a methyl group;
$R_5$ is $-(CH_2)_m-$;
$m$ is 0 or 1;
$n$ is 1, 2, 3 or 4;
$X$ is $-O-$, $-S-$, $-NH-$ or $-NR_8-$;
$R_6$ is a hydrogen atom, $H-(CH_2)_n$, is cyano group or a carbamoyl group;
$R_7$ is a hydrogen atom, a chlorine atom, a bromine atom, $H-(CH_2)_n$, $H-(CH_2)_nO-$, a nitro group, a sulfo group, a carboxy group, a cyano group, a phenyl group, a phenoxy group, an acetyl group or a benzoyl group; and
$R_8$ is $H-(CH_2)_n$ or

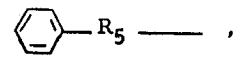

said polymer containing functional groups attached to the polymer chain of said polymer directly as a pendant group or through a divalent group, said functional group being selected from the group consisting of a thienylacrylate functional group, a thienylacrylamide functional group, a thienylthioacrylate functional group and a thienyl thioacrylamide functional group and at least one sensitizer.

2. A photosensitive element comprising a support and having thereon a photosensitive resin composition layer as claimed in claim 1.

3. The photosensitive element of claim 2, wherein said sensitizer is an aromatic carbonyl compound or an aromatic nitro compound.

4. The photosensitive element of claim 2, wherein said sensitizer is a sensitizing dye or a pyrylium salt.

5. The photosensitive element of claim 2, wherein said sensitizer is a quinoid compound.

6. A photosensitive composition comprising as the main photosensitive component a high molecular weight polymer containing monomer units of the following general formula:

$$R_1CH=CR_6COXR_4OCOC(-R_3)$$
$$\quad\quad\quad\quad\quad\quad\quad\quad CH_2$$

wherein
$R_1$ is

$R_3$ is a hydrogen atom or a methyl group;
$R_4$ is $-CH_2CH_2-$, $-CH_2CH_2-CH_2-$, $-CH_2-CH-$, $-CH_2CH-$,
$\quad\;\;|$ $\quad\quad\quad\;|$
$\;\;CH_2Cl$ $\quad\;CH_3$ $-CH_2CH_2(OCH_2CH_2)_n-$, $-CH_2-CH-$ or $-CH_2CH-(OCH_2CH)_n-$;
$\quad\;\;|$ $\quad\quad\quad\quad\quad\quad\quad\;|\quad\quad|$
$\;\;C_2H_5$ $\quad\quad\quad\quad\quad\;\;CH_3\;\;CH_3$ $R_5$ is $+CH_2+_m$;
m is 0 or 1;
n is 1, 2, 3 or 4;
X is —O—, —S—, —NH— or —NR$_8$—;
$R_6$ is a hydrogen atom, H+CH$_2$+$_n$, a cyano group or a carbamoyl group;
$R_7$ is a hydrogen atom, a chlorine atom, a bromine atom, H+CH$_2$+$_n$, H+CH$_2$+$_n$O—, a nitro group, a sulfo group, a carboxy group, a cyano group, a phenyl group, a phenoxy group, an acetyl group, or a benzoyl group; and
$R_8$ is H+CH$_2$+$_n$ or

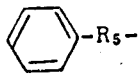

said polymer containing functional groups attached to the polymer chain of said polymer directly as a pendant group or through a divalent group, said functional group being selected from the group consisting of a thienylacrylate functional group, a thienylacrylamide functional group, a thienylthioacrylate functional group and a thienyl thioacrylamide functional group and
at least one sensitizer.

7. A photosensitive element comprising a support and having thereon a photosensitive resin composition layer as claimed in claim 6.

8. The photosensitive element of claim 7, wherein said sensitizer is an aromatic carbonyl compound or an aromatic nitro compound.

9. The photosensitive element of claim 7, wherein said sensitizer is a sensitizing dye or a pyrylium salt.

10. The photosensitive element of claim 7, wherein said sensitizer is a quinoid compound.

11. A photosensitive composition comprising as the main photosensitive component a high molecular weight polymer containing monomer units of the following general formula:

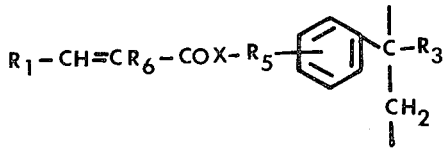

wherein
$R_1$ is

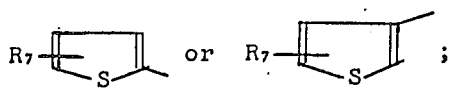

$R_3$ is a hydrogen atom or a methyl group;
$R_5$ is +CH$_2$+$_m$;
m is 0 or 1;
n is 1, 2, 3 or 4;
X is —O—, —S—, —NH— or —NR$_8$—;
$R_6$ is a hydrogen atom, H+CH$_2$+$_n$, a cyano group or a carbamoyl group;
$R_7$ is a hydrogen atom, a chlorine atom, a bromine atom, H+CH$_2$+$_n$, H+CH$_2$+$_n$O—, a nitro group, a sulfo group, a carboxy group, a cyano group, a phenyl group, a phenoxy group, an acetyl group, or a benzoyl group; and
$R_8$ is H+CH$_2$+$_n$ or

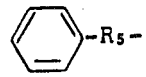

said polymer containing functional groups attached to the polymer chain of said polymer directly as a pendant group or through a divalent group, said functional group being selected from the group consisting of a thienylacrylate functional group, a thienylacrylamide functional group, a thienylthioacrylate functional group and a thienyl thioacrylamide functional group and
at least one sensitizer.

12. A photosensitive element comprising a support and having thereon a photosensitive resin composition layer as claimed in claim 11.

13. The photosensitive element of claim 12, wherein said sensitizer is an aromatic carbonyl compound or an aromatic nitro compound.

14. The photosensitive element of claim 12, wherein said sensitizer is a sensitizing dye or a pyrylium salt.

15. The photosensitive element of claim 12, wherein said sensitizer is a quinoid compound.

16. A photosensitive composition comprising as the main photosensitive component a high molecular weight polymer containing monomer units of the following general formula:

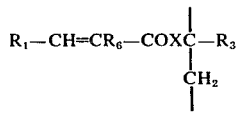

wherein
$R_1$ is

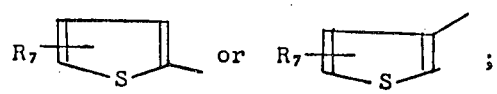

$R_3$ is a hydrogen atom or a methyl group;
$R_5$ is +CH$_2$+$_m$;
m is 0 or 1;
n is 1, 2, 3 or 4;
X is —O—, —S—, —NH— or —NR$_8$—;
$R_6$ is a hydrogen atom, H+CH$_2$+$_n$, a cyano group or a carbamoyl group;
$R_7$ is a hydrogen atom, a chlorine atom, a bromine atom, H+CH$_2$+$_n$, H+CH$_2$+$_n$O—, a nitro group, a sulfo group, a carboxy group, a cyano group, a phenyl group, a phenoxy group, an acetyl group, or a benzoyl group; and
$R_8$ is H+CH$_2$+$_n$ or

said polymer containing functional groups attached to the polymer chain of said polymer directly as a pendant group or through a divalent group, said functional group being selected from the group consisting of a thienylacrylate functional group, a thienylacrylamide functional group, a thienylthioacrylate functional group and a thienyl thioacrylamide functional group and at least one sensitizier.

17. A photosensitive element comprising a support and having thereon a photosensitive resin composition layer as claimed in claim 16.

18. The photosensitive element of claim 17, wherein said sensitizer is an aromatic carbonyl compound or an aromatic nitro compound.

19. The photosensitive element of claim 17, wherein said sensitizer is a sensitizing dye or a pyrylium salt.

20. The photosensitive element of claim 17, wherein said sensitizer is a quinoid compound.

21. A photosensitive composition comprising as the main photosensitive compondent a high molecular weight polymer containing monomer units of the following general formula:

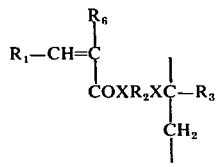

wherein
R₁ is

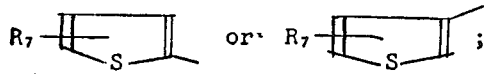

R₂ is

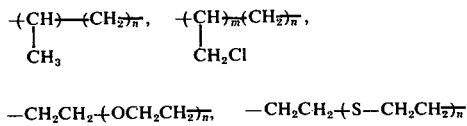

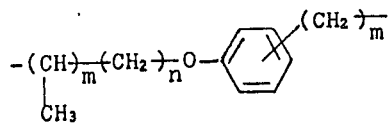

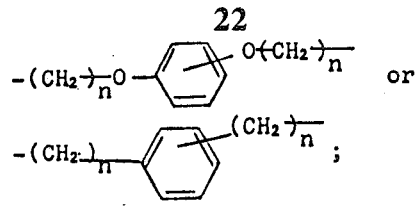

R₃ is a hydrogen atom or a methyl group;
R₅ is $-(CH_2)_{\overline{m}}$;
$m$ is 0 or 1;
$n$ is 1, 2, 3 or 4;
X is —O—, —S—, —NH— or —NR₈—;
R₆ is a hydrogen atom, $H-(CH_2)_{\overline{n}}$, a cyano group or a carbamoyl group;
R₇ is a hydrogen atom, a chlorine atom, bromine atom, $H-(CH_2)_{\overline{n}}$, $H-(CH_2)_{\overline{n}}O-$, a nitro group, a sulfo group, a carboxy group, a cyano group, a phenyl group, a phenoxy group, an acetyl group, or a benzoyl group; and
R₈ is $H-(CH_2)_{\overline{n}}$ or

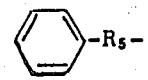

said polymer containing functional groups attached to the polymer chain of said polymer directly as a pendant group or through a divalent group, said functional group being selected from the group consisting of a thienylacrylate functional group, a thienylacrylamide functional group, a thienylthioacrylate functional group and a thienyl thioacrylamide functional group and at least one sensitizer.

22. A photosensitive element comprising a support and having thereon a photosensitive resin composition layer as claimed in claim 21.

23. The photosensitive element of claim 22, wherein said sensitizer is an aromatic carbonyl compound or an aromatic nitro compound.

24. The photosensitive element of claim 22, wherein said sensitizer is a sensitizing dye or a pyrylium salt.

25. The photosensitive element of claim 22, wherein said sensitizer is a quinoid compound.

* * * * *